United States Patent [19]
Jeffries et al.

[11] Patent Number: 5,886,871
[45] Date of Patent: Mar. 23, 1999

[54] HEAT SINK RETENTION APPARATUS AND METHOD FOR COMPUTER SYSTEMS

[75] Inventors: John Jeffries, Marble Falls; Doug Dewey, Pflugerville, both of Tex.

[73] Assignee: Dell U.S.A., L.P., Round Rock, Tex.

[21] Appl. No.: 940,129

[22] Filed: Oct. 1, 1997

[51] Int. Cl.⁶ .................................................. H05K 7/20
[52] U.S. Cl. .................... 361/704; 361/687; 361/709; 361/690; 257/718
[58] Field of Search .................... 165/80.3, 185; 174/16.3, 138 G; 257/706, 707, 712–713, 718–719, 726–727; 361/687, 690, 697, 704, 707, 709–710, 758, 807–810

[56] References Cited

U.S. PATENT DOCUMENTS

| | | |
|---|---|---|
| 4,710,852 | 12/1987 | Keen . |
| 5,331,057 | 7/1994 | Kyung et al. . |
| 5,422,790 | 6/1995 | Chen . |
| 5,526,874 | 6/1996 | White . |
| 5,625,227 | 4/1997 | Estes et al. . |
| 5,673,176 | 9/1997 | Penniman et al. . |
| 5,748,446 | 5/1998 | Feightner et al. ....................... 361/709 |

FOREIGN PATENT DOCUMENTS

| | | | |
|---|---|---|---|
| 4267548 | 9/1992 | Japan | 257/718 |
| 4343253 | 11/1992 | Japan | 257/718 |

OTHER PUBLICATIONS

IBM Tech Discl Bulletin, "Heatsink Attachment for Improved Electro–Magnetic Compatibility and Shock Performance", vol. 38, No. 3, pp. 383–385., 257/718, Mar. 1995.

U.S. Serial No. 08/763,238, filed on Dec. 10, 1996, Computer System With Heat Sink Having An Integrated Grounding Tab, Ralph Remsburg et al., Abstract and 3 sheets of drawings.

*Primary Examiner*—Gregory Thompson
*Attorney, Agent, or Firm*—Haynes and Boone, L.L.P.

[57] ABSTRACT

A computer system includes a chassis and a rigid support member mounted therein. A heat sink is connected to the support member by a resilient retainer which is movably mounted on the heat sink. The retainer is movable between a first position out of engagement with the support member, and a second position engaged with the support member. The retainer is formed of a continuous strip of resilient material and includes a handle for facilitating manual access to move the retainer between the first and second positions. The retainer is captive to the heat sink in either of the first and second positions.

21 Claims, 4 Drawing Sheets

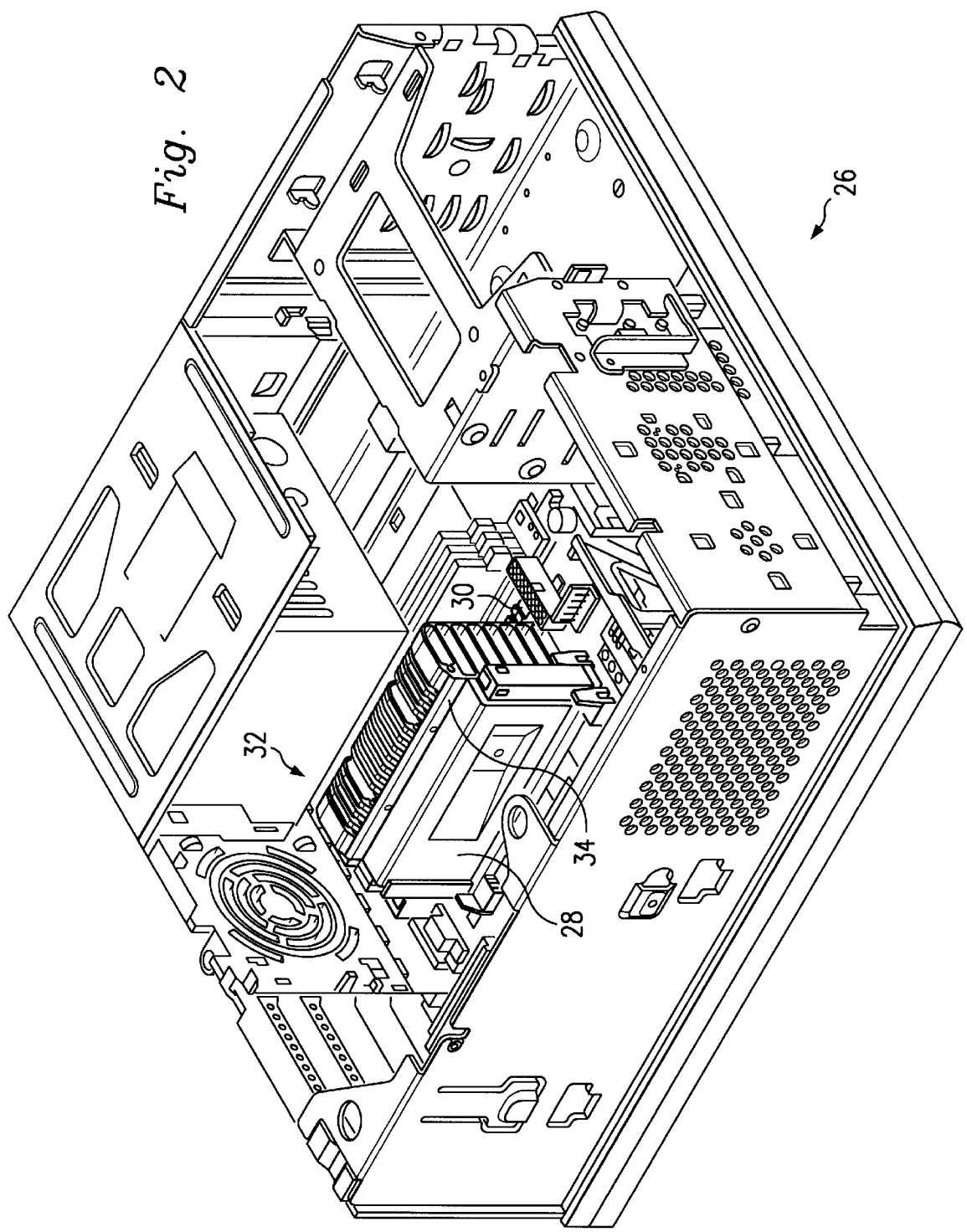

HEAT SINK RETENTION APPARATUS AND METHOD FOR COMPUTER SYSTEMS

BACKGROUND

The disclosures herein relate generally to heat sinks used in a computer chassis and more particularly to a quick connect, quick disconnect retainer for mounting the heat sink in the chassis.

The many electrical components in a computer chassis create a lot of heat which must be removed to keep the system functioning. Many heat removal schemes are used in this environment including fans, heat sinks and combinations thereof. Heat sinks, due to their mass, must be properly supported within the chassis so as to withstand shock and vibration loads.

Heat sinks are often mounted in an abutting relationship with a thermal plate which conducts heat from a heat producing component to the heat sink. Due to the crowded confines of computer chassis and the crowding and stacking of components therein, sufficient support is sometimes difficult to achieve. This problem is compounded by the desirability for non-threaded connectors and supports which provide for the quick attachment and release of components for the purposes of manufacturing and maintenance. Threaded connectors, such as screws, bolts, etc., are undesirable due to the extended time required to attach and remove them and also due to the lack of room available for the manipulation of tools needed to attach and remove such connectors.

One example of a non-threaded connector discloses a spring steel bayonet type retainer for securing encapsulated semiconductor devices to circuit boards either directly or through an intermediate heat dissipator. This device includes spring fingers and bayonet arms. The retainer is installed by urging the bayonet arms through a hole in a mounting tab of the semiconductor device and through the circuit board where barbs on the terminal ends of the bayonet arms lock the arms into the hole. The length of the arms is such that the body portion of the retainer is flexed to compliantly exert a force on the semiconductor device to hold it to the circuit board. This device, however, is not easily removed and is not captive to the device it secures.

Therefore, what is needed is a method and apparatus whereby a resilient retainer can be movably mounted on a heat sink and snapped into and out of engagement with a support on the chassis, for ease of installation and removal of the heat sink during manufacturing and maintenance.

SUMMARY

One embodiment, accordingly, provides a method and apparatus for attaching and removing a heat sink from a rigid support in a computer chassis in a manner which permits a movable retainer to snap into and out of engagement with the support. To this end, a computer system includes a chassis, a support mounted in the chassis, a heat sink, and a resilient retainer movably mounted on the heat sink. The retainer is movable between a first detent position out of engagement with the support, and a second detent position engaged with the support.

A principal advantage of this embodiment is that the retainer is captive to the heat sink in either a latched or unlatched position so that the retainer will not unexpectedly separate from the heat sink and contact electronic components on an adjacent circuit board.

BRIEF DESCRIPTION OF THE DRAWINGS

FIG. 2 is an isometric view illustrating an embodiment of a heat sink mounted in a computer chassis.

DETAILED DESCRIPTION OF THE PREFERRED EMBODIMENT

Figure 1:
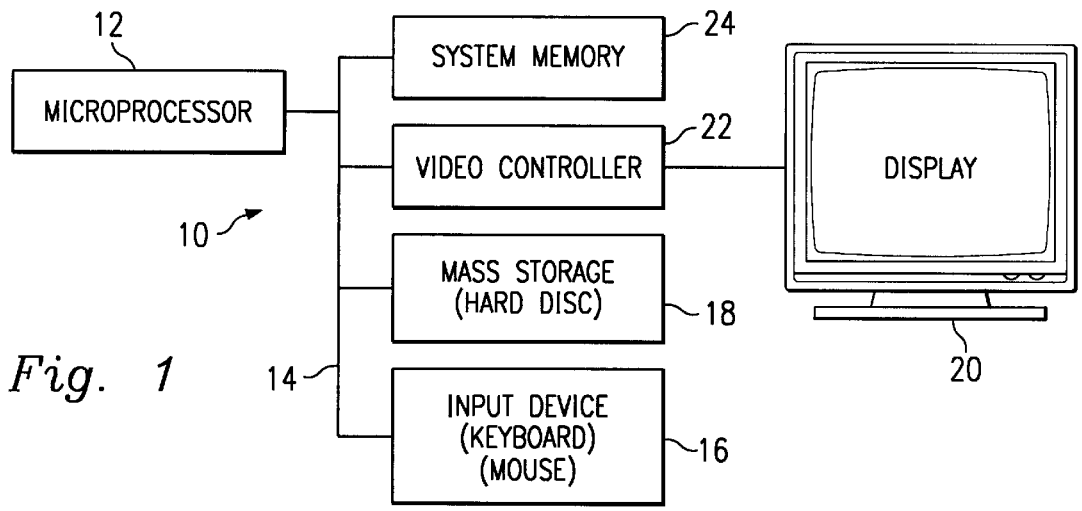
FIG. 1 is a diagrammatic view illustrating an embodiment of a typical computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 3A:
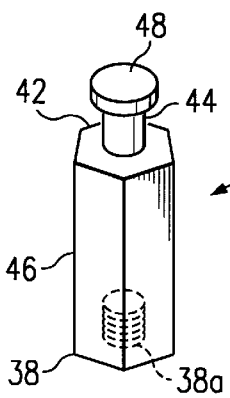
FIG. 3a is an isometric view illustrating an embodiment of the standoff.
Figure 3:
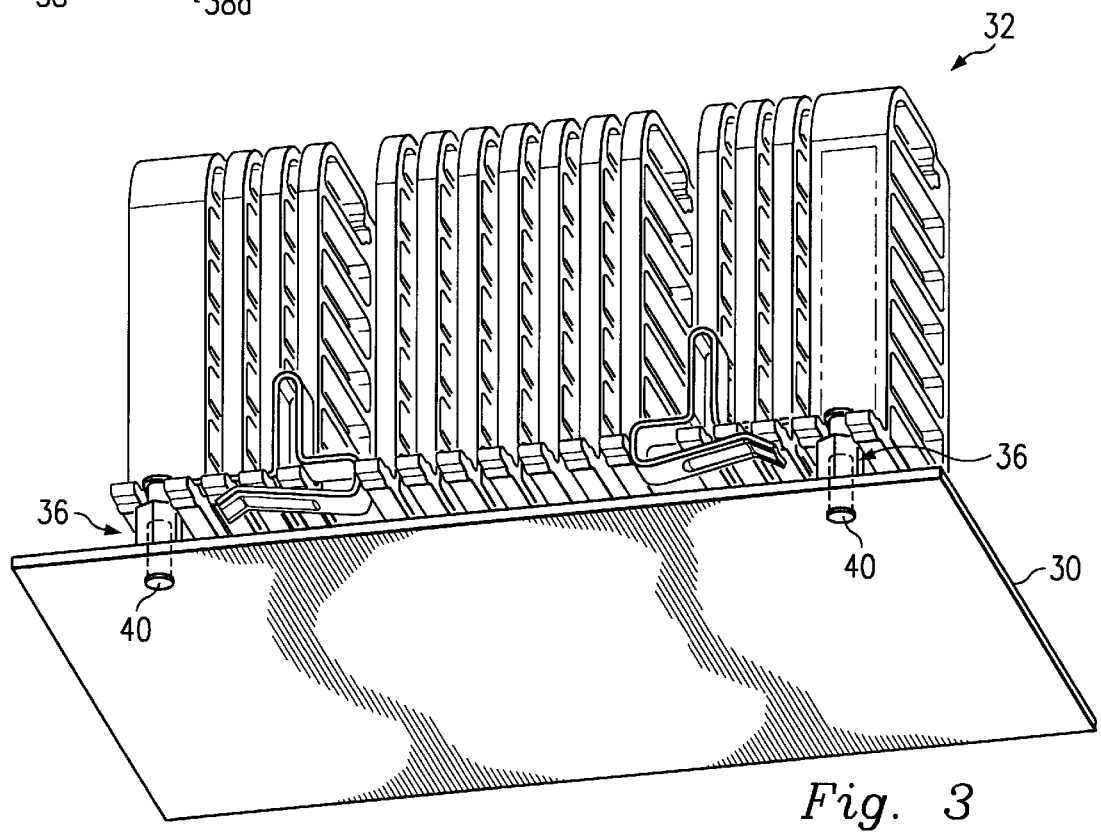
FIG. 3 is an isometric view illustrating an embodiment of the heat sink having clips disengaged with standoffs.

In FIG. 2, a chassis 26 of system 10 includes a processor module 28 and a circuit board 30 mounted therein. A heat sink 32 includes a thermal plate 34 mounted directly to processor module 28 for drawing heat therefrom. Heat sink 32 is mounted directly above circuit board 30 but may not contact board 30 or any of the components thereon (not shown) without resulting damage. As a result, heat sink 32, FIG. 3, which is preferably formed of aluminum, is supported above circuit board 30 by a plurality of rigid support members such as standoffs 36, which are mounted on board 30 and extend upwardly therefrom. Standoffs 36, FIG. 3a, have a first end 38, including a threaded recess 38a, which is secured to board 30 by a threaded fastener 40, FIG. 3, extending through board 30. A second end 42, FIG. 3a, of standoff 36 includes an undercut 44, formed between a main body portion 46 and an end cap 48.

Figure 4:
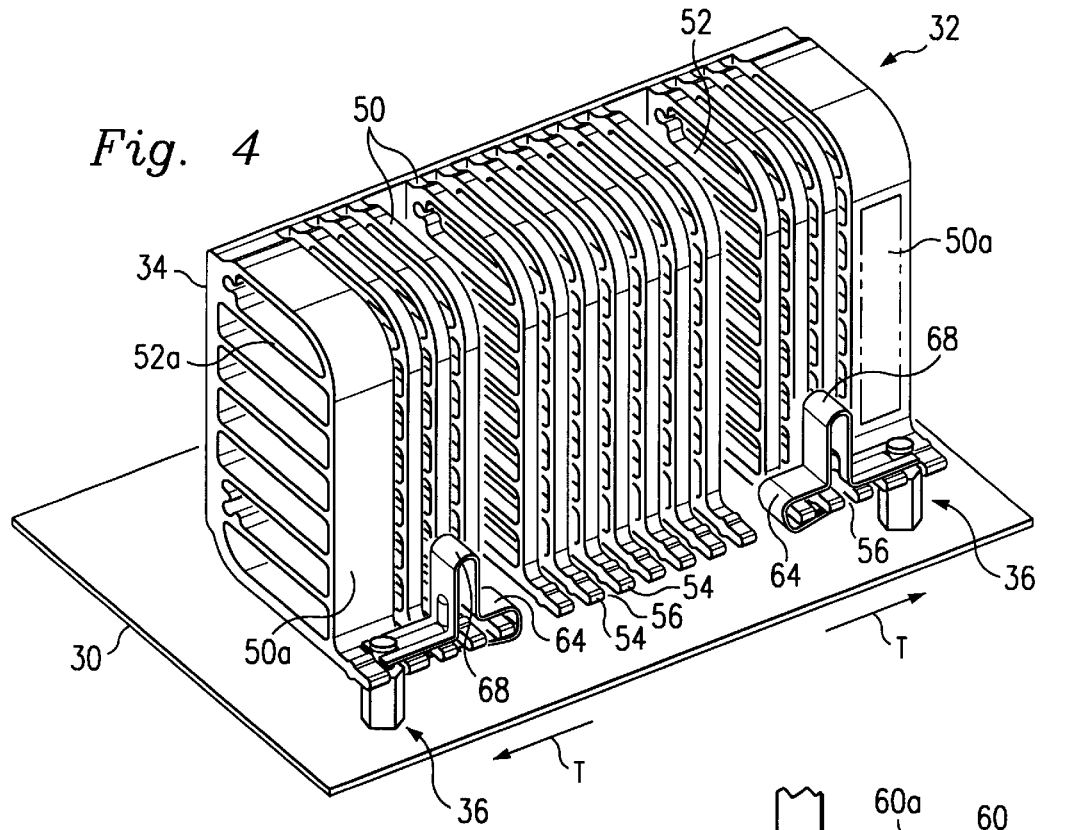
FIG. 4 is an isometric view illustrating an embodiment of the heat sink having clips engaged with the standoffs.

Heat sink 32, FIG. 4, is formed of a plurality of spaced apart vertical members 50 attached to thermal plate 34. Each vertical member 50 includes a plurality of horizontal members 52 extending between vertical members 50 and thermal plate 34. Each vertical member 50 also includes an extension member 54. As a result, the several extension members 54 extend side-by-side having spaces or detents 56 therebetween. Vertical members 50a, at opposite ends of heat sink 32, are wider than others of the vertical members 50 and, as such, each includes a plurality of horizontal members 52a and a pair of extension members 54a having a slot 58, FIG. 5, therebetween, sufficient to receive standoff 36. Also, each extension member 54 and 54a includes a first surface 60, FIG. 5a, including a raised guide 60a, and a second opposed surface 62, including a raised guide 62a. Thus, a succession of adjacent extension members 54 and 54a provide a guide path for movement of a retainer, discussed below.

Figure 6:
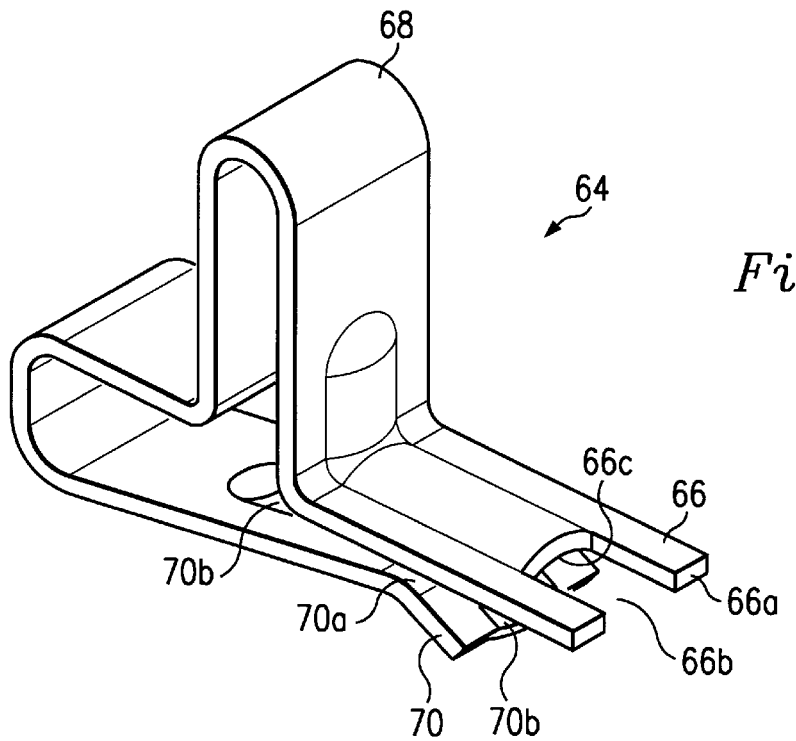
FIG. 6. is an isometric view illustrating an embodiment of a clip.
Figure 7:
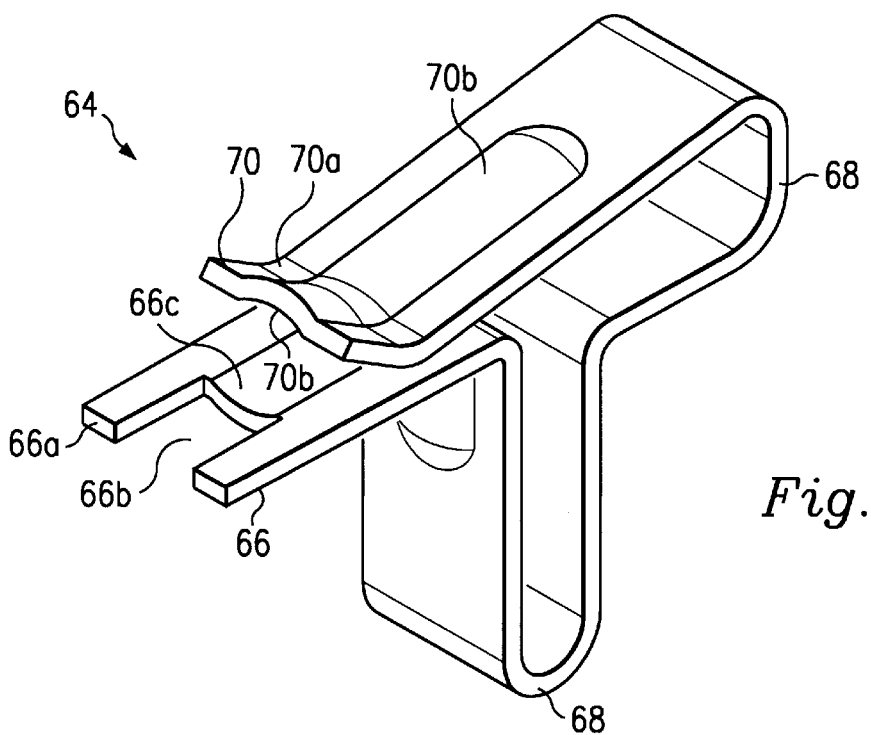
FIG. 7 is an inverted isometric view illustrating an embodiment of the clip.

A retainer 64, FIGS. 6 and 7, is formed of a continuous strip of a resilient material, preferably steel, and is contoured to include a first extension member 66, a handle 68 and a second extension member 70. First extension member 66 includes a receiver end 66a having a notch 66b formed therein. Also, member 66 includes an extended guide groove 66c formed therein. Second extension member 70 includes a bend forming a detent engagement portion 70a and an extended guide groove 70b formed therein which is opposite guide groove 66c of first extension member 66. Notch 66b is of a size sufficient for receiving undercut 44, FIG. 3a, of standoff 36. Guide grooves 66c and 70b are of a size and disposition for receiving and sliding along the path provided by the plurality of adjacent opposed guides 60a, 62a, respectively, FIG. 3a.

In operation, referring to the above-described features illustrated in the drawings, heat sink 32 is appropriately fastened, by screws for example, to processor module 28 which abuts with thermal plate 34 to provide efficient heat transfer thereto. Each standoff 36 extends upwardly from board 30, FIG. 5, and into slots 58 between extension members 54a by a distance sufficient to position undercut 44 adjacent guide 60a.

Figure 5A:
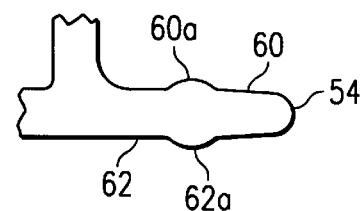
FIG. 5a is a partial side view illustrating an embodiment of an extension member on the heat sink.
Figure 5:
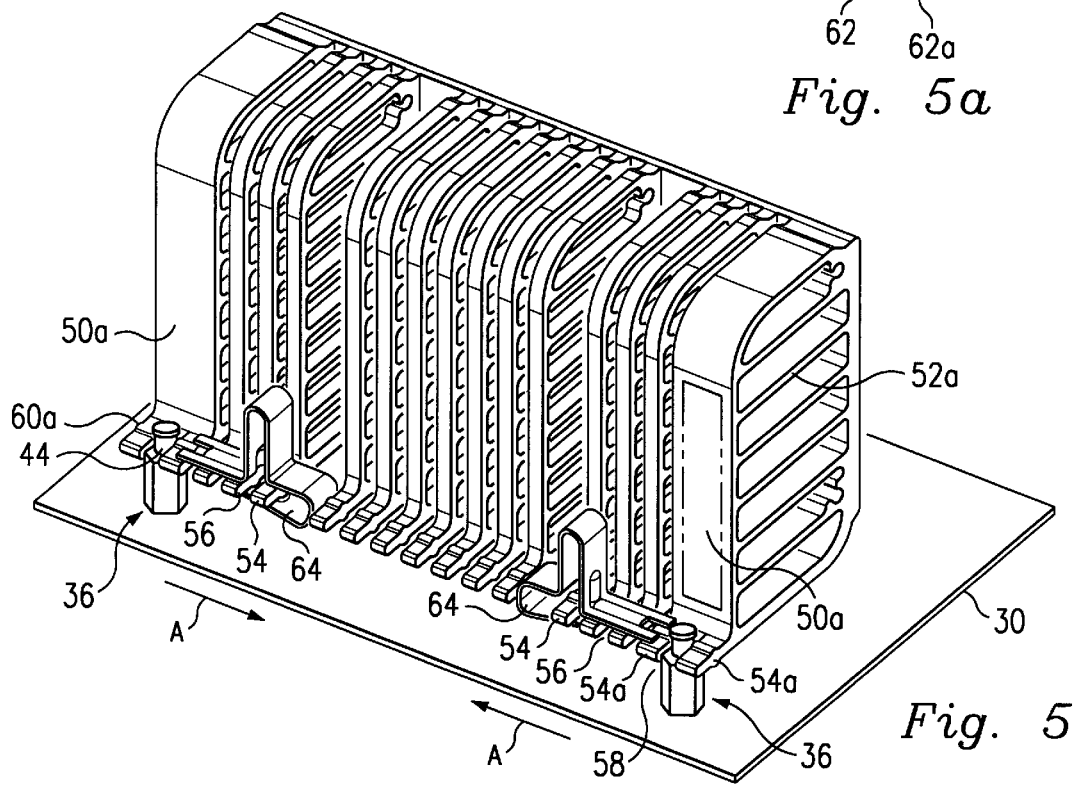
FIG. 5 is an isometric view illustrating an embodiment of the heat sink having clips disengaged from the standoffs.

Each retainer 64, illustrated out of engagement with standoffs 36 in FIG. 5, is positioned on extension members 54 so that guide grooves 66c and 70b, FIG. 6, engage guides 60a, 62a, respectively, FIG. 5a. Also, each receiver end 66a, FIG. 6, including notch 66b, is adjacent each slot 58, FIG. 5, and detent engagement portion 70a, FIG. 6, is engaged with a detent space 56, FIG. 5, between adjacent extension members 54. Each retainer 64 may be moved into engagement with standoffs 36 as illustrated in FIG. 4, by manually urging handle 68 in a direction, designated T, toward standoff 36, thus moving detent engagement portion 70a, FIG. 6, to engage an adjacent space 56, FIG. 4, and secure notch 66b, FIG. 6, into engagement with undercut 44, FIG. 3a, between main body portion 46 and end cap 48 of standoff 36. Thus, heat sink 32 is secured to standoffs 36 by retainers 64, FIG. 4. Subsequent movement of retainers 64 in a direction, designated A, FIG. 5, away from standoffs 36, disengages retainers 64 from standoffs 36.

As it can be seen, the principal advantages of these embodiments are that the retainer provides a means for retaining the heat sink while enabling a user to remove the heat sink without tools. Unlike other attachment solutions using screws, these embodiments do not require tools for attachment and detachment, and allows both technicians and customers to easily and manually detach the sink for the purposes of replacement of reseating.

Unlike other attachments using loose clips or other hardware, which require additional time to handle and assemble, and can be installed incorrectly or dropped on electronic components with resulting damage, these embodiments allow the clips to be provided already installed and positioned on the heat sink by the heat sink supplier, prior to the point of use.

Detent features are incorporated in these embodiments to positively hold the clips captive to the heat sink in either an open or closed position, allowing them to be installed and maintained in the open position so that no damage occurs when the heat sink and processor are seated using significant force. The detent features also provide for easy manual engagement with tactile feedback to the installer indicating a positive latch has been achieved. These embodiments also provide the person attaching or detaching the clips with clear access to them, both visually and physically, even in completely assembled and configured systems, regardless of the general layout of the system.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer system comprising:
    a chassis;
    a support member mounted in the chassis;
    a heat sink mounted on the support member, the heat sink including a receiver for receiving the support member;
    a guide provided on the heat sink; and
    a resilient retainer movably mounted on the heat sink, the retainer including a groove formed therein for engaging the guide for guided movement between a first detent position out of engagement with the support member, and a second detent position engaged with the support member.

2. The computer system as defined in claim 1 wherein the support member is a standoff having an undercut formed at one end thereof.

3. A computer system comprising:
    a chassis;
    a support member mounted in the chassis, the support member being a standoff having an undercut formed at one end thereof;
    a heat sink mounted on the support member the heat sink including a slot formed therein for receiving the undercut; and
    a resilient retainer movably mounted on the heat sink, the retainer being movable between a first detent position out of engagement with the support member, and a second detent position engaged with the support member.

4. The computer system as defined in claim 3 wherein the heat sink includes a plurality of detents formed therein.

5. The computer system as defined in claim 4 wherein the heat sink includes a guide formed thereon.

6. The computer system as defined in claim 4 wherein the retainer includes a groove formed therein for receiving the guide.

7. The computer system as defined in claim 6 wherein the retainer includes a detent engagement portion formed thereon.

8. The computer system as defined in claim 7 wherein the retainer includes a notch formed therein for releasably engaging the undercut.

9. The computer system as defined in claim 3 wherein the retainer is a continuous strip of resilient material captively mounted on the heat sink.

10. A computer system comprising:
    a chassis;
    a support member mounted in the chassis;

a heat sink mounted on the support member; and a resilient retainer movably mounted on the heat sink, the retainer formed of a continuous strip of resilient material captively mounted on the heat sink, and including a handle formed thereon, the retainer being movable between a first detent position out of engagement with the support member, and a second detent position engaged with the support member.

11. The computer system as defined in claim 10 wherein the retainer includes a first extension member and a second extension member adjacent the first extension member.

12. The computer system as defined in claim 11 wherein the first extension member includes a receiver end having a notch formed therein and includes a first guide groove formed therein.

13. The computer system as defined in claim 12 wherein the second extension member includes a detent engagement portion and a second guide groove formed therein.

14. The computer system as defined in claim 13 wherein the first guide groove is opposite the second guide groove for engaging guides formed on the heat sink.

15. A retainer comprising:

a continuous strip of resilient material including a first extension member and a handle;

a second extension member adjacent the first extension member;

the first extension member including a receiver having a notch and a first guide groove formed therein;

the second extension member including a detent engagement portion and a second guide groove formed therein; and the first guide groove being opposite the second guide groove.

16. A system for mounting a heat sink in a computer chassis comprising:

a first receiver formed in the heat sink for receiving a rigid support member mounted in the chassis;

a plurality of detents formed on the heat sink;

a guide formed on the heat sink; and a retainer movably mounted on the heat sink including a detent engagement portion formed thereon, a groove formed therein for receiving the guide on the heat sink, and a second receiver formed therein for releasably engaging the rigid support member.

17. The system as defined in claim 16 wherein the first receiver is a slotted portion of the heat sink.

18. The system as defined in claim 17 wherein the rigid support member includes an undercut formed at one end thereof, the undercut being insertable into said slotted portion.

19. The system as defined in claim 18 wherein the second receiver is a notched end of the retainer, the notched end being engageable with the undercut.

20. A method of retaining a heat sink in a computer chassis comprising the steps of:

providing a guide on the heat sink;

mounting a standoff member in the chassis;

movably mounting a resilient clip on the heat sink, the clip including a groove formed therein;

positioning the heat sink in the chassis to receive the standoff member; and sliding the clip groove along the guide from a first position out of engagement with the standoff member, to a second position engaging the standoff member.

21. A computer system comprising:

a microprocessor;

an input coupled to provide input to the microprocessor;

a mass storage coupled to the microprocessor;

a display coupled to the microprocessor by a video controller;

a memory coupled to provide storage to facilitate execution of computer programs by the microprocessor;

a chassis;

a rigid support member mounted in the chassis;

a heat sink mounted on the support member, the heat sink including a receiver for receiving the support member;

a guide provided on the heat sink;

a resilient retainer movably mounted on the heat sink, the retainer including a groove formed therein for engaging the guide for guided movement between a first detent position out of engagement with the support member, and a second detent position engaged with the support member.

* * * * *